(12) United States Patent
Van Bommel et al.

(10) Patent No.: US 10,274,164 B2
(45) Date of Patent: Apr. 30, 2019

(54) LIGHTING DEVICE COMPRISING A PLURALITY OF DIFFERENT LIGHT SOURCES WITH SIMILAR OFF-STATE APPEARANCE

(71) Applicant: SIGNIFY HOLDING B.V., Eindhoven (NL)

(72) Inventors: Ties Van Bommel, Eindhoven (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/784,374

(22) Filed: Oct. 16, 2017

(65) Prior Publication Data

US 2018/0112850 A1 Apr. 26, 2018

(30) Foreign Application Priority Data

Oct. 21, 2016 (EP) ..................... 16194964

(51) Int. Cl.
| | |
|---|---|
| *F21V 9/00* | (2018.01) |
| *F21V 9/08* | (2018.01) |
| *F21K 9/64* | (2016.01) |
| *H01L 33/50* | (2010.01) |
| *F21Y 115/10* | (2016.01) |
| *F21Y 113/13* | (2016.01) |

(52) U.S. Cl.
CPC .................. *F21V 9/08* (2013.01); *F21K 9/64* (2016.08); *H01L 33/50* (2013.01); *F21Y 2113/13* (2016.08); *F21Y 2115/10* (2016.08)

(58) Field of Classification Search
USPC ........................................... 362/231
See application file for complete search history.

(56) References Cited

U.S. PATENT DOCUMENTS

| | | | |
|---|---|---|---|
| 7,551,341 B1 * | 6/2009 | Ward | G03B 33/08 359/259 |
| 7,682,850 B2 | 3/2010 | Harbers et al. | |
| 7,847,302 B2 | 12/2010 | Basin et al. | |

(Continued)

FOREIGN PATENT DOCUMENTS

| | | |
|---|---|---|
| WO | WO2015015363 A1 | 2/2015 |
| WO | WO2015018638 A1 | 2/2015 |
| WO | WO2016150789 A1 | 9/2016 |

*Primary Examiner* — Tuyen K Vo
(74) *Attorney, Agent, or Firm* — Akarsh P. Belagodu

(57) ABSTRACT

The invention provides a lighting device comprising a plurality of different light sources with a first subset of one or more first light sources configured to provide first light source light and a second subset of one or more second light sources configured to provide second light source light having a spectral distribution different from the first light source light, wherein the one or more first light sources have a light-source off-state color appearance, wherein the one or more second light sources comprise one or more optical filters, wherein the one or more optical filters are selected to convert less than 10% of said second light source light, wherein each optical filter is associated with a respective second light source, and wherein the one or more optical filters have the same color appearance as the off-state color appearance of the one or more first light sources.

20 Claims, 5 Drawing Sheets

(56) References Cited

U.S. PATENT DOCUMENTS

| | | | |
|---|---|---|---|
| 2011/0042584 A1* | 2/2011 | Bechtel | G01N 21/6452 250/459.1 |
| 2011/0049551 A1* | 3/2011 | Wiesmann | H01L 33/50 257/98 |
| 2012/0201025 A1* | 8/2012 | Cash | F21K 9/232 362/231 |
| 2012/0326627 A1 | 12/2012 | McDaniel, Jr. | |
| 2013/0270585 A1* | 10/2013 | Mei | H01L 25/0753 257/89 |
| 2014/0097742 A1* | 4/2014 | Van Bimmel | H05B 33/145 313/483 |
| 2014/0168943 A1* | 6/2014 | Peeters | C09K 11/06 362/84 |
| 2015/0116381 A1* | 4/2015 | Kim | G09G 3/3413 345/691 |
| 2015/0311406 A1 | 10/2015 | Lange et al. | |
| 2015/0338727 A1* | 11/2015 | Sugiyama | F21L 14/023 362/84 |
| 2016/0118550 A1 | 4/2016 | Pun | |

\* cited by examiner

LIGHTING DEVICE COMPRISING A PLURALITY OF DIFFERENT LIGHT SOURCES WITH SIMILAR OFF-STATE APPEARANCE

FIELD OF THE INVENTION

The invention relates to a lighting device with different types of light sources, especially comprising solid state light sources that generate light at different wavelengths for providing lighting device light comprising the light of one or more of the different types of light sources.

BACKGROUND OF THE INVENTION

LED light emitters with a plurality of LEDs are known in the art. US2013/0270585, for instance, describes an LED light emitter including a single emitter structure having a substrate with a plurality of light emitting diodes (LEDs) arranged thereon, wherein the plurality of LEDs includes at least one first LED die that produces a first color light, and at least one second LED die that produces a second color light. The LED light emitter also includes a total internal reflection (TIR) lens positioned to collect light emitted from the single emitter structure and adapted to mix the light from the plurality of LEDs to produce a uniform light. The plurality of LEDs are selected such that the light output by the LED light emitter has a desired color temperature when an equal current is supplied to all of the plurality of LEDs.

SUMMARY OF THE INVENTION

White or off-white phosphor converted LEDs can be combined with red LEDs in applications to provide e.g. one or more of high quality light with CRI beyond 90, saturated white light, high efficiency light sources, and color controllable light sources. However, these white and red LEDs have a different colored appearance which is not always appreciated in some applications. It appears to be desirable to hide the difference.

An option to solve this problem is to configure a scattering layer over both types of LEDs. However, this may lead to extra light loss from the white LED, which is not desirable either. Hence, when two different light sources, a first and a second light source are applied, their visual appearance in the off-state, may be different. Here, it is especially referred to the light emitting surface of such light source, like a LED die, a phosphor layer, a silicone dome, a phosphor comprising plate(let), etc.

Hence, it is an aspect of the invention to provide an alternative lighting device, especially based on solid state light sources, which preferably further at least partly obviates one or more of above-described drawbacks.

Especially, the invention provides a lighting device ("device") comprising a plurality of different light sources with a first subset of one or more first light sources configured to provide first light source light and a second subset of one or more second light sources configured to provide second light source light, wherein especially the second light source light has a spectral distribution different from the first light source light, wherein the one or more first light sources have a light-source off-state color appearance, wherein the one or more second light sources comprise one or more optical filters, wherein especially the one or more optical filters are selected to convert less than 30%, such as less than 20%, such as especially less than 10%, of the second light source light, wherein especially each optical filter is associated with a respective second light source, and wherein the one or more optical filters have the same color appearance (in a second light-source off-state) as the off-state color appearance of the one or more first light sources.

With such lighting device, the light source may have in the off-state essentially the same color. In other words, the light-source off-state color appearance of both types of light sources may essentially be identical. In this way, all light sources of the device may appear as essentially having the same color. Hence, they appear as the same type of light sources. Here, the term "color" may refer to any known color, including white, but does (thus) especially not refer to black. Though the optical filter may include a black pigment, it will not essentially consist of a black pigment in view of transmission purposes.

With the present invention, it is possible to use different type of LEDs, including e.g. white light emitting LEDs in combination with red LEDs and color tune the appearance of the red LEDs (in the off-state) such that the red LEDs may have essentially the same color as the white LEDs off-state, which may e.g. be yellow (assuming by way of example a blue LED with a yellow (luminescent) material). Especially, the color (in the off-state) may refer to any color, not including black or white (see further also below). This is especially of relevance as the first light source(s) in specific embodiments include a luminescent material which is a non-white and non-black pigment, such as e.g. a cerium comprising garnet. In such instances, the optical filter will essentially also have such color (as the pigment).

Herein, the term "luminescent material" and "phosphor" may be used for identical materials and refer to the same type of materials, that especially generate light upon excitation with e.g. blue and/or UV radiation. Further, the term "luminescent material" may also relate to a plurality of different luminescent materials. Likewise, the term "phosphor" may refer to a plurality of different phosphors (or luminescent materials).

As indicated above, the device comprises a plurality of different light sources with a first subset of one or more first light sources configured to provide first light source light and a second subset of one or more second light sources configured to provide second light source light, wherein especially the second light source light has a spectral distribution different from the first light source light. Hence, the lighting device comprises at least two different types of light sources in the sense that the different types of light sources provide light with different spectral distributions. Hence, to this end the device comprises a first subset of one or more light sources, such as at least two, and a second subset of one or more light sources, such as at least two. In general, each subset comprises a plurality of light sources, such as at least three. Assuming e.g. solid state light sources, the light sources within a subset may include solid state light sources selected from the same bin.

However, the light source light generated by the first light sources spectrally differs from the light source light of the second light sources (i.e. they have differing spectral distributions). Especially, the different types of light sources do thus not include solid state light sources from the same bin, or, when they include solid state light sources from the same bin, one or more of the first light sources and the second light sources include one or more luminescent materials which, together with the light of the respective solid state light source(s), lead to different spectral distributions of the first light source light and the second light source light. This will further be elucidated below. In specific embodiments, the one or more first light sources comprise one or more solid state light sources, and/or the one or more second light sources comprise one or more solid state light sources. Especially, each light source comprises a source of light, such as a solid state light source, and optionally a light conversion material ("luminescent material) configured to convert at least part of the light of the source of light. The light escaping from the light source, especially from its light emitting surface may essentially consist of the light of the source of light. When a light conversion material is comprised by the light source, the light source light may comprise light conversion material light and optionally also light from the source of light.

More especially, the different types of light sources provide different colors of light, such as selected from violet, blue, green, yellow, orange, red, pink and white, especially selected from blue, green, yellow, orange, red, and white. For instance, at least 50% of the spectral power may be in the visible. However, one or more of them may also provide IR radiation or UV radiation. In such embodiments, at least 50% of the spectral power may be in the IR or UV.

The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The terms "visible", "visible light" or "visible emission" refer to light having a wavelength in the range of about 380-780 nm. The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

Especially, each light source within the subset is configured to provide essentially identical first light source light or second light source light, respectively. Hence, both the first subset as the second subset, and thus also the lighting device, are (is) especially configured to provide visible light. However, as indicated above the invention is not limited to visible lighting device light and/or visible light source light only.

Herein, the invention is especially explained in relation to a first light source and a second light source, a first subset and a second subset, etc. However, more in general the invention can be defined as having at least two different subsets. Hence, in embodiments the invention provides a lighting device ("device") comprising a plurality of different light sources with two or more subsets of light sources, (the light sources from different subsets) configured to provide mutually different light source light, wherein light sources of one or more subsets have one or more optical filters, wherein especially each optical filter is associated with a respective light source from such subset, wherein in the off-state of all light sources, the light sources of the two or more subsets, especially all subsets have the same color appearance. Here below, the invention is further defined in relation to two subsets. However, this should thus not be interpreted as the device only limited to two subsets. Further, as also indicated below, terms like "first" and "second" are especially used to address different items, but these terms do not necessarily include an order, or—if applicable at all—the first necessarily being larger or smaller than the second (in embodiments this might also be the other way around).

In specific embodiments, the one or more first light sources are configured to provide the first light source light having a first peak wavelength $\lambda 1$, and the one or more second light sources are configured to provide the second light source light having a second peak wavelength $\lambda 2$. These peak wavelengths may be in the spectral color ranges as indicated above, and optionally outside the visible (see above). Hence, especially $\lambda 2 > \lambda 1$. Even more especially the differences between the peak wavelengths is at least 10 nm, such as at least 15 nm, even more especially at least 20 nm, such as at least 30 nm, like at least 50 nm. When more two or more subsets are applied, the difference between a largest peak wavelength (of one of the subsets) and a smallest peak wavelength (of one of the other subsets) is at least 10 nm, such as at least 15 nm, even more especially at least 20 nm, such as at least 30 nm, like at least 50 nm. The term "peak wavelength" refers to the maximum in the spectral distribution.

In specific embodiments, the one or more first light sources are configured to provide the first light source light having a first dominant wavelength $\lambda 1$, and the one or more second light sources are configured to provide the second light source light having a second dominant wavelength $\lambda 2$. These dominant wavelengths may be in the spectral color ranges as indicated above, and optionally outside the visible (see above. Hence, especially $\lambda 2 > \lambda 1$. Even more especially the differences between the dominant wavelengths is at least 10 nm, such as at least 15 nm, even more especially at least 20 nm, such as at least 30 nm, like at least 50 nm. When more two or more subsets are applied, the difference between a largest dominant wavelength (of one of the subsets) and a smallest dominant wavelength (of one of the other subsets) is at least 10 nm, such as at least 15 nm, even more especially at least 20 nm, such as at least 30 nm, like at least 50 nm.

The invention especially addresses situations wherein the first light source(s) and second light source(s) would have in the off-state different colors (including the option of one being black). For instance, one of the light sources might have a yellow appearance (in the off-state) due to the presence of a yellow luminescent material, such as a white LED, and the other of the light sources may have a red appearance (in the off-state), such as a red LED. The appearance especially refers to the light emitting surface, i.e. the surface from which light source light escapes from the light source.

The invention solves this problem by providing one of the (types of) light sources with an optical filter, such as a coating, that has a color appearance similar to that of the other (type of) light sources. When there are more than two different subsets, also light sources in more than two subsets may be provided with an optical filter. The optical filters may be identical or may differ (dependent upon the subset).

For instance, with reference to the previous example, the red LED may be provided with an optical filter, configured downstream of the LED. Especially, the optical filter is part of the light source.

Hence, in embodiments such light source may comprise a solid state light source with downstream thereof the optical filter. The optical filter may be in physical contact with the solid state light source or may be configured at some (small) distance of the solid state light source, though in general at a distance of equal to or less than 10 mm (but larger than 0.1 mm). In specific embodiments, the one or more optical filters comprise one or more coatings (i.e. especially a coating layer). In such embodiments, the coating may be in physical contact with a solid state light source. In yet other embodiments, the one or more optical filters comprise one or more (silicone) domes. In yet other embodiments, the one or more optical filters comprise one or more plate(lets), e.g. ceramic platelets, etc. The platelet may e.g. be glued to the LED die. Herein, terms like "one or more" may refer to the fact that there are one or more light sources in the respective subset; hence, there will e.g. also be one or more optical filters in e.g. the second subset.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

As indicated above, especially each optical filter is associated with a respective second light source. More especially, the optical filter is comprised by the (second) light source. As indicated above, for instance the (second) light source may include a solid state light source and the optical filter associated with the solid state light source, such as in physical contact with the solid state light source. Especially, in the present invention the optical filter is only associated to a specific type of light sources. A single optical filter is especially not configured downstream of both the first light source(s) and the second light source(s). Therefore, in the present invention each optical filter is associated with a respective second light source. This does not exclude the present of other optical elements downstream of both the first light source(s) and the second light source(s), but the optical filter herein defined is configured downstream of a specific type of light sources, especially those that have an off-state color different from an off-state color of other types of light sources (which may especially include a colored luminescent material).

In a specific embodiment, the light source comprises a solid state light source (such as a LED or laser diode). The term "light source" may also relate to a plurality of light sources, such as 2-200 (solid state) LED light sources. Hence, the term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. Especially, each light source comprises a PCB or a submount (as carrier). Hence, the carriers of the first light source(s) in specific embodiments differ from the carriers from the second light source(s). In alternative, all light sources within a subset share the same PCT or submount. Hence, all first light sources may be carried by a same first carrier, such as a PCB, and all second light sources may be carried by a same second carrier, such as a PCB (with the first carrier and second carrier being different).

In general however, each light source in at least one of the subsets, will be associated with a (respective) optical filter. In specific embodiments, a COB may be associated with the optical filter. Hence, only a single solid state light source, or a limited number, such as equal to or less than 200 solid state light sources, such as equal to or less than 100 solid state light sources, may be associated to an optical filter, and form thereby a single light source. In general, each light source within a subset may thus be discernable as individual light source. This is also the reason that different colors may be less desired. An individual light source, be it a single light source, or be it a COB, whether or not with an optical filter, may provide a light emitting area (of the light emitting surface) up to about 400 mm$^2$, such as up to about 100 mm$^2$.

As one of the type of light sources, herein by way of example indicated as the first light source(s) have a color in the off-state, e.g. because such light source includes a colored luminescent material, with the optical filter associated with the other type of light sources, the appearance of the light sources can be made more homogeneous. Especially, the optical filter may be chosen such that absorption of the (second) light source light is low or essentially absent.

For instance, when the first light sources include a luminescent material that is also a pigment having a yellow-green color, such material may also be used as optical filter for a red monochromatic LED as such material may essentially not absorb red light. Hence, the same color appearance may be obtained for different types of light sources, whereas light output may not essentially influenced by the optical filter. Herein, the term "optical filter", when associated to the light source for the color homogeneity purposes of the present invention, especially refers to a layer, such as a coating, that is configured to transmit at least part of the light of the light source with which it is associated, but which optical filter also has a color, such as selected from violet, blue, green, yellow, orange, red, pink and white. Hence, the one or more optical filters especially have the same color appearance (in a second light-source off-state) as the off-state color appearance of the one or more first light sources.

Therefore, especially the one or more optical filters are selected to convert less than 30%, such as less than 20%, even more especially less than 10% of said second light source light, even more especially less than 1% of the second light source light, in especially at least the visible spectral region. Hence, the one or more optical filter are especially selected such, that these do not comprise luminescent materials for the second light source. In other words, the optical filters are not configured as converters for the second light source light. Therefore, the optical filters may be considered as a kind of "optically inert" filters, essentially inert for the second light source light.

Therefore, in yet further embodiments, the one or more optical filters are selected to absorb less than 30% of said second light source light, especially less than 20% of the second light source light, even more especially less than 10%, such as less than 5%, especially in the visible spectral region, such as less than about 1%. Hence, at maximum 30% if all photons generated in the visible part of the spectrum by the second light source(s) will be lost by absorption (and optionally conversion in visible light of having another spectral distribution than the upstream light) by the optical filter, especially less than 20% of all photons in the visible part of the spectrum will be absorbed, or even less, such as less than 10% or less than 5%.

To obtain a low absorption of the second light source light, especially an optical filter is selected that may have an absorption in the visible, but which absorption has a low or essentially no overlap with the emission of the second light source light. Therefore, in specific embodiments, the spectral distribution of the light source light of the source of light and the absorption spectrum of the optical filter material have a (normalized) spectral overlap SO in the range of $0 \leq SO \leq 0.2$, such as $0 \leq SO \leq 0.1$, wherein the normalized spectral overlap may be defined as:

$$SO = \frac{\int_{\lambda_x}^{\lambda_y} I(\lambda)\varepsilon(\lambda)d\lambda}{\int_{\lambda_x}^{\lambda_y} I(\lambda)d\lambda \, \varepsilon_{max}}$$

wherein $I(\lambda)$ is the intensity of the source of light as a function of wavelength, wherein $\varepsilon(\lambda)$ is the absorption coefficient as a function of wavelength based on the absorption spectrum, wherein $\varepsilon_{max}$ is the maximum extinction coefficient in the wavelength range of 380-780 nm (i.e. $\lambda_x$-$\lambda_y$), based on the absorption spectrum, and wherein $\lambda_x$ and $\lambda_y$ define the wavelength range of 380-780 nm. For instance, the normalized spectral overlap may be 0.2 or less, such as in the range of 0-0.1.

Likewise, as indicated above, when the optical filter comprises a luminescent material, the spectral distribution of the light source light of the source of light and the absorption spectrum of the optical filter material have a (normalized) spectral overlap SO in the range of $0 \leq SO \leq 0.2$, such as $0 \leq SO \leq 0.1$, wherein the normalized spectral overlap may be defined as:

$$SO = \frac{\int_{\lambda_x}^{\lambda_y} I(\lambda)\varepsilon'(\lambda)d\lambda}{\int_{\lambda_x}^{\lambda_y} I(\lambda)d\lambda \, \varepsilon'_{max}}$$

wherein $I(\lambda)$ is the intensity of the source of light as a function of wavelength, wherein $\varepsilon'(\lambda)$ is the excitation coefficient as a function of wavelength based on the excitation spectrum, wherein $\varepsilon'_{max}$ is the maximum extinction coefficient in the wavelength range of 380-780 nm (i.e. $\lambda_x$-$\lambda_y$), based on the excitation spectrum, and wherein $\lambda_x$ and $\lambda_y$ define the wavelength range of 380-780 nm. For instance, the normalized spectral overlap may be 0.2 or less, such as in the range of 0-0.1.

Especially, the optical filter has a light transmission in the range of 50-100%, especially in the range of 70-100%, for light generated by the source (and optional light conversion material) of light upstream of the optical filter, and having a wavelength selected from the visible wavelength range. In this way, the optical filter is transmissive for visible light from the source of light, such as a solid state light source.

The transmission or light permeability can be determined by providing light at a specific wavelength with a first intensity to the optical filter and relating the intensity of the light at that wavelength measured after transmission through the optical filter, to the first intensity of the light provided at that specific wavelength to the optical filter (see also E-208 and E-406 of the CRC Handbook of Chemistry and Physics, 69th edition, 1088-1989).

In specific embodiments, an optical filter may be considered transmissive when the transmission of the radiation at a wavelength or in a wavelength range, especially at a wavelength or in a wavelength range of radiation generated by a source of radiation as herein described, through a 1 mm thick layer of the optical filter, especially even through a 5 mm thick layer of the optical filter, under perpendicular irradiation with said radiation is at least about 80%, such as at least about 85%, such as even at least about 90%.

As e.g. one of the light sources may include a luminescent material (i.e. light conversion material) also being a pigment, the luminescent material is especially configured to absorb the light of the source of light of the (first light source). Such luminescent material may however have a low absorption, or negligible absorption for light provided by the source of light of the second light source. Therefore, the one or more optical filters are selected to have a larger absorption at one or more emission wavelengths of the first light source light than at one or more emission wavelengths of the second light source light. In such instance, the luminescent material that may be used for the first light source as luminescent material may be used for the second light source as optical filter (see further also below).

Hence, in specific embodiments the one or more optical filters are selected to have a larger absorption at the first peak wavelength λ1 than at the second peak wavelength λ2.

The color appearance may especially refer to the hue. Hence, both the first light sources and the second light sources (or more especially their light emitting surfaces) may in the off-state essentially have the same hue. Small differences may be possible, however. Hue is amongst others defined in a HSL or a HSV representation or space. Herein, it is by way of example referred to the HSL representation with H ranging from 0-360 or ranging from 0-360°. Red colors are found close to zero and close to 360, as the HSL representation can include a circular representation (with 0-360°). Yellow can e.g. found at 60°, green at 120°, different types of blue at and between 180° and 240, etc.

Hence, especially the hues of the light sources (more especially their light emitting surfaces) in the off-state, are identical, or close to identical. Therefore, in specific embodiments |H1−H2|=0 or when |H1−H2|≠0 and the larger hue is defined as H1, then $|H1-H2| \leq 0.2*H_{max}$ or $|H1-H2-360| \leq 0.2*H_{max}$. Here, again, only for definition purposes H1 is chosen as the larger hue value. Of course, H2 may also be chosen as the larger value, which would then result in the conditions $|H2-H1| \leq 0.2*H_{max}$ or $|H2-H1-360| \leq 0.2*H_{max}$. Herein, further only for definition purposes H1 is chosen to be the larger. Hence, the first hue may be associated with the first light source(s), or with the second light source(s). Likewise, the second hue may be associated with the second light source(s), or with the first light source(s). Note that we here define the color of the light source, or the color appearance of the light source, not of the light of the light source. In the on-state, the differences in colors of the light sources may be less relevant, as the (device) light may dominate the appearance of the individual light sources (and even viewing the light sources may be undesired in view of eye protection).

Hence, the one or more optical filters may especially have the same hue as the off-state color appearance of the one or more first light sources. However, even more especially in addition to hue, one or more of lightness and saturation are the same. Therefore, in specific embodiments the off-state color appearances of the first light sources and second light sources have a first hue value H1 and second hue value H2, a first lightness value L1 and a second lightness value L2, and have a first saturation value S1 and a second saturation value S2, respectively, wherein: $|H1-H2|=0$ or when $|H1-H2|\neq 0$ and the larger hue is defined as H1, then $|H1-H2|\leq 0.2*H_{max}$ or $|H1-H2-360|\leq 0.2*H_{max}$; $|L1-L2|\leq 0.2*L_{max}$; and $|S1-S2|\leq 0.2*S_{max}$, and wherein $H_{max}$ is a maximum hue value, wherein H is defined based on a HSL representation with H ranging from 0-360, wherein $L_{max}$ is a maximum lightness value, and $S_{max}$ is a maximum saturation value.

In general, L and S are considered to vary between 0-100 or 0-100%, respectively, though other scales may also be possible. Especially, the saturation S is larger than 0(%) and the lightness L is larger than 0(%).

In more specific embodiments (when the hues are not identical), $|H1-H2|\leq 10$ or $|H1-H2-360|\leq 10$, and one or more of the following applies: $|L1-L2|\leq 0.1*L_{max}$ and $|S1-S2|\leq 0.1*S_{max}$.

As indicated above, hue, lightness and brightness especially refer to the light emitting surface of the respective light sources in the off-state.

Above, already some examples have been given where one of the (type of) light sources, in general indicated as first light source(s) includes a luminescent material (herein also indicated as phosphor), and which luminescent material especially has a color (and is thus a pigment). This color may be any color, but not black.

Therefore, in specific embodiments the one or more first light sources comprise one or more phosphor converted solid state light sources comprising a phosphor, especially the phosphor of the one or more phosphor converted solid state light sources determine the light-source off-state color appearance of said one or more first light sources. The other (type of) light source(s), in general indicated as second light source(s), may especially refer to solid state light source(s) per se, i.e. without further conversion with a luminescent material. Hence, such light sources may be bare LEDs, optionally protected with e.g. a silicone dome, etc. Such light sources may especially be indicated as monochromatic solid state light sources, even though the spectral distribution may e.g. show a peak having a width of a few nanometers. However, such solid state light sources especially provide a single, relatively narrow band, and may also include lasers.

Hence, in embodiments the one or more second light sources comprise one or more monochromatic solid state light sources (as sources of light). Especially in such embodiments, the one or more optical filters comprise said phosphor.

Especially two types of embodiments may be of relevance.

In a first type of embodiments, the one or more first light sources are configured to provide blue first light source light and green phosphor light, wherein the one or more second light sources are configured to provide red second light source light, wherein the one or more optical filters comprise said phosphor. Such phosphor providing green phosphor light may also have a green(ish) color. This phosphor may be used as optical filter, such as a coating, for the second light source(s) and will essentially not absorb the red light of the second light source(s).

In a second type of embodiments, the one or more first light sources are configured to provide blue first light source light and yellow phosphor light, wherein the one or more second light sources are configured to provide red second light source light, wherein the one or more optical filters comprise said phosphor. Such phosphor providing yellow phosphor light may also have a yellow(ish) color. This phosphor may be used as optical filter, such as a coating, for the second light source(s) and will essentially not absorb the red light of the second light source(s).

However, other embodiments may also be applied, such as a second light source comprising a luminescent material configured upstream of the optical filter (and downstream of the source of light), or embodiments wherein one or more of the first light sources and second light sources are configured to provide radiation in the UV or IR.

Herein, the terms "luminescent material" or "phosphor" may also refer to a plurality of different luminescent materials. Such plurality of different luminescent materials may also have a color appearance.

Hence, the hue (and lightness and brightness) may be based on a combination of different luminescent materials. Alternatively or additionally, the hue may be based on a combination of different pigments.

Specific phosphors of interest that may be used to provide green of yellow light are cerium comprising garnet phosphors. Hence, in embodiments the phosphor comprises $A_3B_5O_{12}:Ce^{3+}$, wherein A is selected from the group consisting of Sc, Y, Tb, Gd, and Lu, wherein B is selected from the group consisting of Al and Ga.

The lighting device may be configured to provide white light. However, the lighting device may also be configured to provide color light. As the lighting device comprises at least two different types of light sources, the subsets, or even all individual light sources, may be controlled, which may allow a tuning of the color of the lighting device light and/or a tuning of the color temperature of the lighting device light. In specific embodiments, however, whether or not the color and/or color temperature of the lighting device light is controllable, especially the lighting device is configured to provide white lighting device light in one or more of (a) an on-state of one or more first light sources and (b) an on-state of one or more second light sources. Hence, the lighting device will include an off-state, and may include one of more different on-states. Such on-states may refer to different intensities and/or different color temperatures and/or different colors of the lighting device light. The term "lighting device light" refers to the light generated by the device and which includes the first light source light and/or the second light source light.

Hence, in specific embodiments the invention provides a plurality of different light sources, wherein a subset includes one or more light sources with a luminescent material, wherein the luminescent material is configured to convert part of the light of one or more sources of light comprised by the one or more light sources (i.e. the luminescent material is functional as luminescent material) and wherein another subset comprises one or more other light sources, wherein the one or more other light sources comprise the same luminescent material as pigment (for the one or more sources of light comprised by the one or more light sources), such that the light emission surfaces (or "light exit windows") of the light sources (of the one or more subsets) have the same color appearance in the off-state. Hence, when the luminescent material is configured as pigment, the luminescent material is essentially not functional as luminescent material but "only" has the function of a pigment.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, etc.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1A:
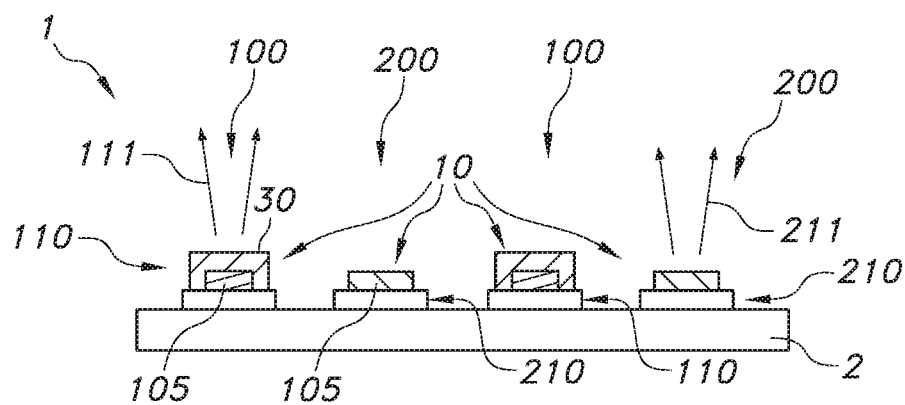
FIGS. 1a-1b: schematically depict some aspects
Figure 1B:
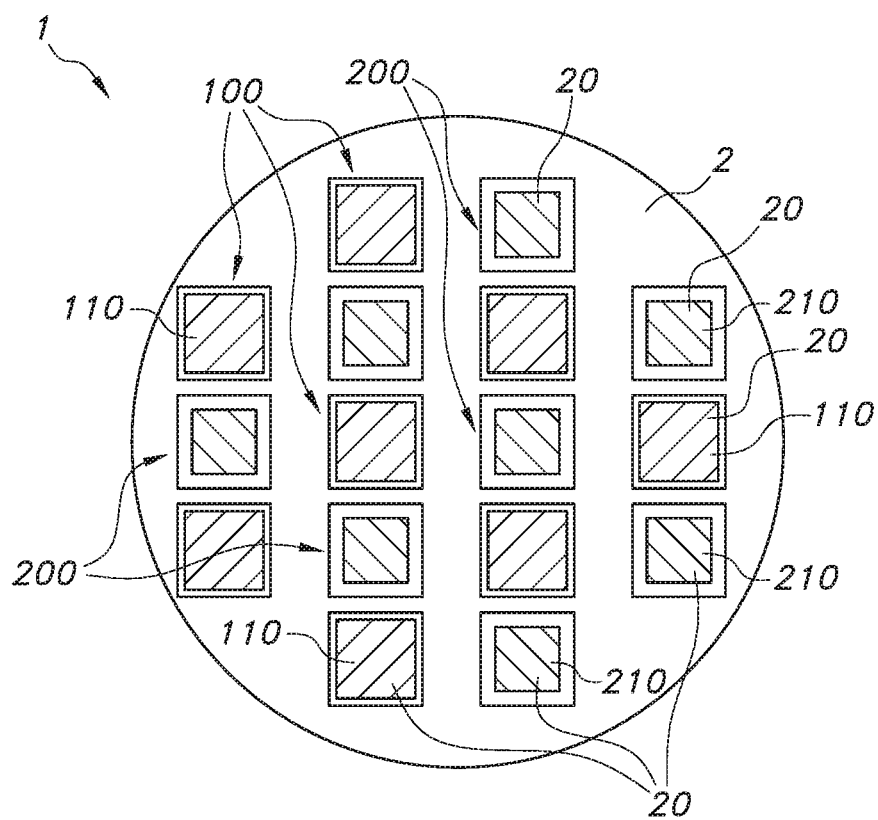

As indicated above, (off-) white phosphor converted LEDs can be combined with red LEDs in applications to provide high quality light with CRI beyond 90, saturated white light, high efficiency light sources, and color controllable light sources. An example is schematically depicted in FIGS. 1a-1b. However, these white LEDs, e.g. the light sources indicated with references 110 in FIG. 1a and red LEDs, e.g. the light sources indicated with references 120 in FIG. 1a, have a different colored appearance which is not always appreciated in some applications. It is desirable to hide the difference. For this purpose scattering layer can be placed over both types of LEDs. However, this leads to extra light loss from the white LED.

FIGS. 1a-1b schematically depict lighting device 1 comprising a plurality of different light sources 10 with a first subset 100 of one or more first light sources 110 configured to provide first light source light 111 and a second subset 200 of one or more second light sources 210 configured to provide second light source light 211. The light sources 110,210 may be LED packages, such as COBs. Reference 105 indicates a source of light, especially a solid state light source, which is (thus) comprised by the light source(s) 110,201. The solid state light sources for the first light sources 110 and the second light sources 210 may be different, though they may also be the same. When they are the same, the light sources 110,210 may include different type of luminescent materials and/or amounts, such that different types of light source light 111,211 is obtained. In FIG. 1a-2b, and also some further figures, the first light source 110 may include a phosphor 30, such as a cerium comprising garnet phosphor, well known in the art. Light provided by such light conversion material upon excitation by light of the source of light is indicated with reference 31 (see FIG. 2a).

The different light sources 110,210 are configured to provide different types of light. For instance, the first light sources 110 may be phosphor converted light sources with a blue light emitting LED and a yellow light emitting phosphor, which provide together white first light source light 111. Further, for instance the second light sources 210 may be monochromatic LEDs configured to provide red light source light 211 of a relative narrow bandwidth, such as less than 100 nm full width half maximum (FWHM), such as about less than about 70 nm, especially equal to or less than 50 nm. Hence, the second light source light 211 has a spectral distribution different from the first light source light 111. Reference 2 indicates a carrier.

As can be seen, the one or more first light sources 110 have a light-source off-state color appearance that differ from the one or more second light sources 210. This may be undesirable.

Figure 2A:
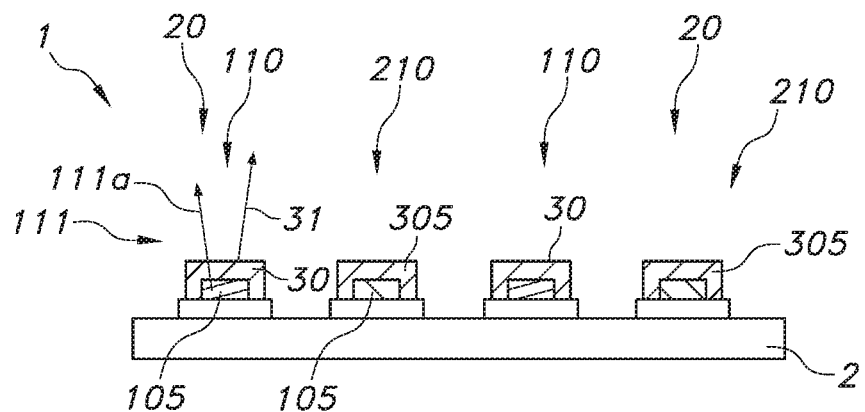
FIGS. 2a-2c: schematically depict some embodiments.
Figure 2B:
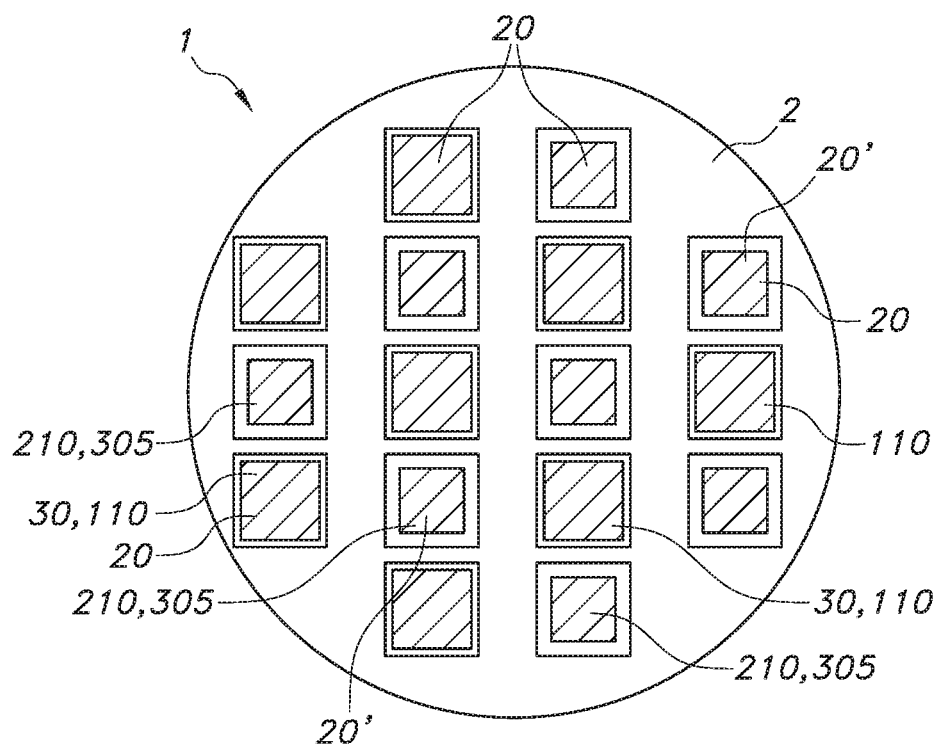

Amongst others, herein we propose coating e.g. Red LEDs with a yellow phosphor so that they all have the same appearance (FIGS. 2a-2b). Therefore, the one or more second light sources 210 have one or more optical filters 305, wherein each optical filter 305 is associated with a respective second light source 210, and wherein the one or more optical filters 305 have the same color appearance as the off-state color appearance of the one or more first light sources 110.

In embodiments, the filter may be a pigment or a phosphor. The phosphor may be an inorganic phosphor such as YAG or LuAG, but may also be an organic phosphor, etc. The (in)organic phosphor may in embodiments be dispersed in a matrix e.g. from silicone.

Reference 20 refers to the light emitting surface of the light source(s). Reference 20' refers to the light emitting surface of the optical filter associated with the (second) light source. In the off-states of the light sources, these surfaces may thus have essentially the same appearance.

Referring to FIG. 2a (but also 1a), the one or more first light sources 110 may be configured to provide blue first light source light 111a and yellow phosphor light 31, wherein the one or more second light sources 210 being configured to provide red second light source light 211. As indicated above, the one or more optical filters 305 comprise the phosphor 30 for similar off-state appearance. Reference 20 refers to the light emitting area of the light source(s). Here, in FIG. 2b the light emitting areas may have essentially the same off-state color appearance. FIGS. 1a and 2a schematically depict side views and FIGS. 1b and 2b schematically depict top views. The light generated by the lighting device 1 is indicated as lighting device light. This lighting device light may include one or more of first light source light and second light source light. When a control system is applied, light sources may independently be controlled, including switching on and off of the different types of light sources, or even each light source individually.

Figure 2C:
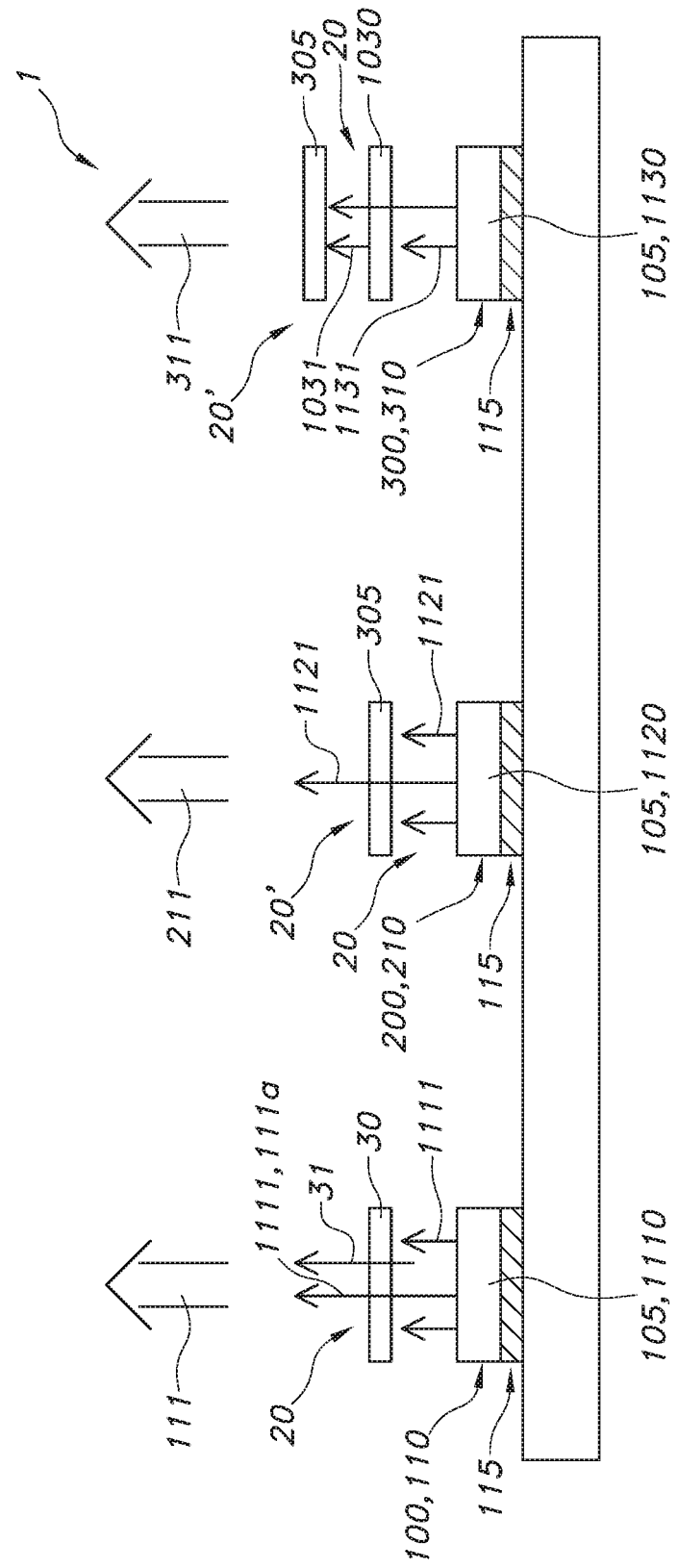

FIG. 2c schematically depict in some more detail some aspects and variants. Here, by way of example three subsets 100,200,300 are schematically depicted, with for the sake of clarity, only one light source in each subset. By way of example, a first source of light 1110 generates light 1111 of which at least part may be converted by the luminescent material 30 into luminescent material light 31. Hence, the first light source light comprises at least luminescent material light 31 and optionally light 1111, such as blue first light source light 111a, and yellow luminescent material light, thereby e.g. providing white first light source light 111. The second light source 210 may essentially be a solid state light source, indicated as second source of light 1120, configured to provide essentially monochromatic light. The light of the source of light 1120 is indicated with reference 1121. The light generated by the second light source 210 is indicated with reference 211 and may essentially consist of this light 1121, as the optical filter 305 is essentially inert for the light 1121. The third light source 310 may comprise a third source of light 1130 configured to generate light 1131 which may be at least partially converted by a luminescent material 30, here for purposes of distinguishing, indicated with reference 1030, which may due to the excitation by the light 1131 generate luminescent material light 1031. Also this light source 310 may include the optical filter 305, by which all three light source in the off-state may have light emitting surfaces 20 that have essentially the same color appearance. The third light source light 311 may comprise at least the luminescent material light 1031 and optionally also light 1131 of the source of light 1130. The optical filter 305 may essentially be inert to the luminescent material light 1031 and optionally also light 1131 of the source of light 1130. Reference 115 indicates a carrier, such as a submount or PCB, which will especially be different for each light source 110,210,310, or at least different for each subset of light sources. Hence, light downstream of the phosphor 30 (or phosphor 1030) will have another spectral composition than light upstream of the phosphor. However, light downstream of the optical filters 305 and light immediately upstream of the optical filters may essentially have the same spectral composition. Optionally, there may be some difference, but especially not due to conversion, but only due to absorption.

As indicated above, the light generated by the lighting device 1 is indicated as lighting device light. This lighting device light may include one or more of first light source light and second light source light, and when referring to FIG. 2c, also third light source light.

Figure 3A:
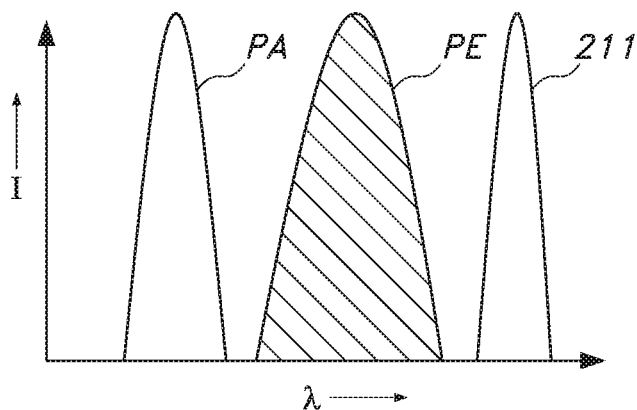
FIGS. 3a-3h: schematically depict some aspects.
The schematic drawings are not necessarily on scale.

In embodiments, a light source is suggested which emits solid state light source light of a first wavelength range, indicated in FIG. 3a as second light source light 211, and a phosphor which absorbs light of a second wavelength range, indicated in FIG. 3a with reference PA (phosphor absorption or excitation band) and emits light of a third wavelength range, indicated in FIG. 3a with reference PE (phosphor emission or phosphor luminescence), wherein there is no overlap between the first and second wavelength range. Here, there is essentially no spectral overlap between the second light source light 211 and the excitation band PA. Hence, the phosphor can be used as essentially inert optical filter for the light source that emits the second light source light 211 indicated in FIG. 3a.

Figure 3B:
Figure 3C:
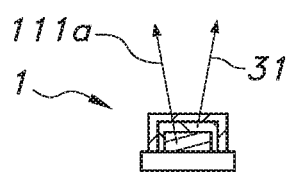

For instance, in an embodiment a yellow phosphor on top of direct emitting red LEDs (FIG. 3b) is suggested or a yellow phosphor on top of phosphor converted red LEDs can be used; the LED can be a blue LED emitting blue light (FIG. 3c). The blue light can be fully converted to red light by the red phosphor.

Figure 3D:
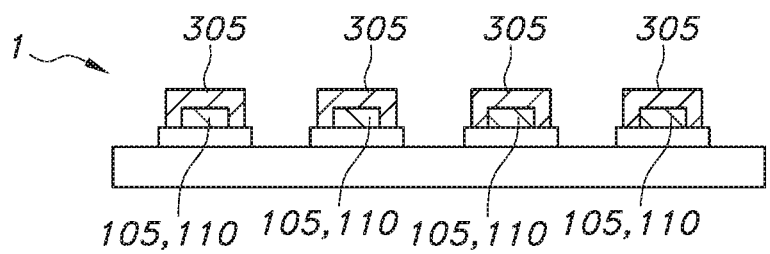

For instance, in an aspect an array of red LEDs on a carrier which is covered by a yellow phosphor (FIG. 3d; see also FIGS. 2a-2b) is proposed. Hence, the invention also provides a light source which emits light source light of a first wavelength range and a phosphor which absorbs light of a second wavelength range and emits light of a third wavelength range, wherein there is essentially no overlap between the first and second wavelength range. Hence, here the phosphor is configured as optical filter(s) 300.

Figure 3E:
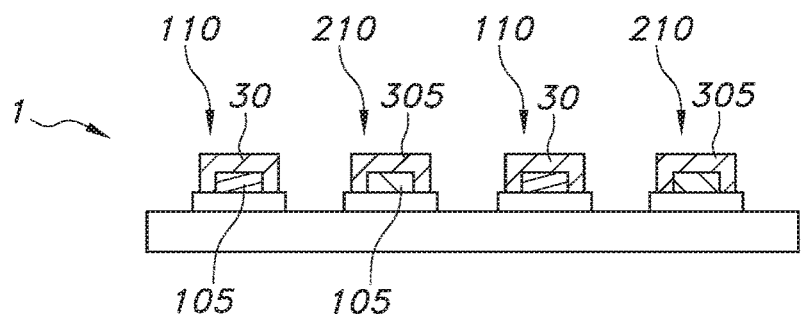
Figure 3F:
Figure 3G:
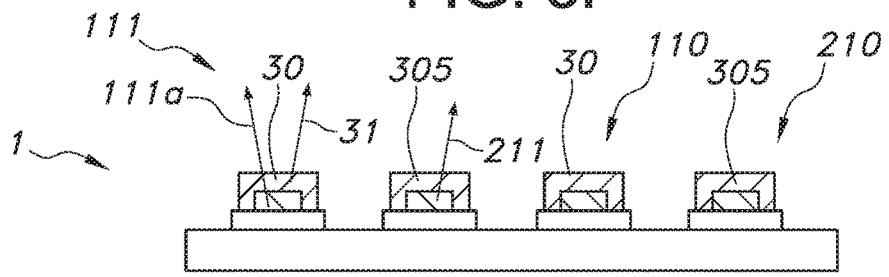

In yet another embodiment a lighting device 1 is suggested, which comprises at least white LED and a red light which comprises a yellow phosphor (FIG. 3e; see also similar FIG. 2a). In yet another embodiment, in case of off white LED, the red LED might also comprise a green phosphor (FIG. 3f. In yet another embodiment a lighting device 1 is suggested which comprises at least one off white LED and a red light which comprises a green phosphor (FIG. 3g). Such lighting device gives a green appearance which might be used for a green image of LED lighting. FIG. 3g also schematically shows that the first light source light 111 comprises luminescent material light 31. Referring to FIG. 3g, the one or more first light sources 110 may be configured to provide blue first light source light 111a and green phosphor light 31, wherein the one or more second light sources 210 being configured to provide red second light source light 211. As indicated above, the one or more optical filters 305 comprise the phosphor 30 for similar off-state appearance.

It goes without saying that combinations of the embodiments presented above are possible. For example, one might combine a white LED together with a direct emitting red LED comprising a yellow phosphor and a phosphor converted red light comprising a yellow phosphor. The suggested configurations can be powered using a power supply and a controller (herein also indicated as "control system") such that the color temperature/amount of saturation can be adjusted.

Figure 3H:
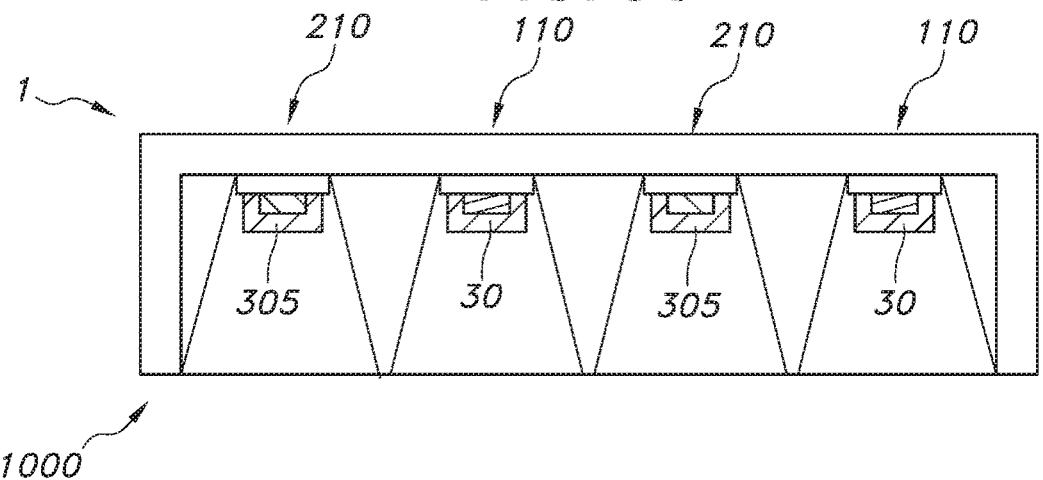

Further, a lamp or luminaire, indicated with reference 1000, using the suggested lighting device (FIG. 3h), is herein suggested.

In the table below, some example are given, wherein only two subsets are assumed. All sources of light are assumed solid state light sources. The phosphors are indicated by the color or type of light generated. The phosphor can be configured for full or partial conversion (of the respective light of the source of light). The color or type of the light generated by the light sources is indicated. Further, the color of the filter is indicated. In embodiments, the optical filters are the same phosphor as indicated for the first light source. However, the principles can be extended to more than two subsets:

| First light source | | Second light source | | |
|---|---|---|---|---|
| Source of light | Phosphor | Source of light | Phosphor | Optical filter (phosphor) |
| Blue | Yellow | Red | | Yellow |
| Blue | Green | Red | | green |
| Blue | Yellow | Blue | Red (e.g. full conversion of blue to red) | Yellow |
| Blue | Green | Blue | Red (e.g. full conversion of blue to red) | green |
| UV | Blue | Red | | Blue |
| UV | Yellow | Red | | Yellow |
| UV | Green | Red | | Green |
| UV | Stack of blue and yellow (e.g. for generating white light) | Red | | Yellow or blue, dependent upon the that is configured downstream of the other |
| Blue | red | IR | | Red |

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to". The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A lighting device comprising:
a plurality of different light sources with a first subset of one or more first light sources configured to provide first light source light and a second subset of one or more second light sources configured to provide second light source light having a spectral distribution different from the first light source light;
wherein the one or more first light sources have a light-source off-state color appearance;
wherein the one or more second light sources comprise one or more optical filters;
wherein the one or more optical filters are selected to convert less than 20% of said second light source light;
wherein each optical filter is associated with a respective second light source; and
wherein the one or more optical filters have the same color appearance as the off-state color appearance of the one or more first light sources.

2. The lighting device according to claim 1, wherein the one or more optical filters have the same hue as the off-state color appearance of the one or more first light sources, and wherein in addition to hue, one or more of lightness and saturation are the same.

3. The lighting device according to claim 1, wherein the off-state color appearances of the first light sources and second light sources have a first hue value H1 and a second hue value H2, a first lightness value L1 and a second lightness value L2, and have a first saturation value S1 and a second saturation value S2, respectively, wherein:
$|H1-H2|=0$ or when $|H1-H2|\neq 0$ and the larger hue is defined as H1, then $|H1-H2|\leq 0.2*H_{max}$ or $|H1-H2-360|\leq 0.2*H_{max}$;
$|L1-L2|\leq 0.2*L_{max}$; and
$|S1-S2|\leq 0.2*S_{max}$;
wherein $H_{max}$ is a maximum hue value, wherein H is defined based on a HSL representation with H ranging from 0-360, wherein $L_{max}$ is a maximum lightness value, and $S_{max}$ is a maximum saturation value.

4. The lighting device according to claim 1, wherein the one or more optical filters are selected to convert less than 5% of said second light source light, and wherein the one or more optical filters are selected to absorb less than 20% of said second light source light.

5. The lighting device according to claim 1, wherein the one or more first light sources are configured to provide said first light source light having a first peak wavelength $\lambda 1$, wherein the one or more second light sources are configured to provide said second light source light having a second peak wavelength $\lambda 2$ wherein $\lambda 1\neq \lambda 2$.

6. The lighting device according to claim 5, wherein $\lambda 2 > \lambda 1$.

7. The lighting device according to claim 1, wherein the one or more optical filters are selected to have a larger absorption at one or more emission wavelengths of the first light source light than at one or more emission wavelengths of the second light source light.

8. The lighting device according to claim 6, wherein the one or more optical filters are selected to have a larger absorption at the first peak wavelength $\lambda 1$ than at the second peak wavelength $\lambda 2$.

9. The lighting device according to 1, wherein the one or more first light sources comprise one or more solid state light sources, wherein the one or more second light sources comprise one or more solid state light sources, and wherein the one or more optical filters comprise one or more coatings.

10. The lighting device according to claim 1, wherein the one or more first light sources comprise one or more phosphor converted solid state light sources comprising a phosphor, wherein the one or more second light sources comprise one or more monochromatic solid state light sources, and wherein the phosphor of the one or more phosphor converted solid state light sources determine the light-source off-state color appearance of said one or more first light sources.

11. The lighting device according to claim 10, wherein the one or more optical filters comprise said phosphor.

12. The lighting device according to claim 10, wherein the one or more first light sources are configured to provide blue first light source light and green phosphor light, wherein the one or more second light sources are configured to provide red second light source light, wherein the one or more optical filters comprise said phosphor.

13. The lighting device according to claim 11, wherein the one or more first light sources are configured to provide blue first light source light and yellow phosphor light, wherein the one or more second light sources are configured to provide red second light source light, wherein the one or more optical filters comprise said phosphor.

14. The lighting device according to claim 13, wherein the phosphor comprises $A_3B_5O_{12}:Ce^{3+}$, wherein A is selected from the group consisting of Sc, Y, Tb, Gd, and Lu, wherein B is selected from the group consisting of Al and Ga.

15. The lighting device according to claim 1, wherein the lighting device is configured to provide white lighting device light in one or more of an on-state of one or more first light sources and an on-state of one or more second light sources.

16. A method comprising:
providing a first subset of light sources configured to provide first light source light, wherein the first subset of light sources have a light-source off-state color appearance;
providing a second subset of light sources configured to provide second light source light, the second light source light having a spectral distribution different from the first light source light; and
applying one or more optical filters to the second subset of light sources that convert less than 20% of said second light source light;
wherein the one or more optical filters have the same color appearance as the off-state color appearance of the first subset of light sources.

17. The method according to claim 16, wherein the one or more optical filters have the same hue as the off-state color appearance of the one or more first light sources, and wherein in addition to hue, one or more of lightness and saturation are the same.

18. The method according to claim 16, wherein the one or more optical filters are selected to convert less than 5% of said second light source light, and wherein the one or more optical filters are selected to absorb less than 20% of said second light source light.

19. A lighting device comprising:
a first subset of light sources configured to provide first light source light, wherein the first subset of light sources have a light-source off-state color appearance;
providing a second subset of light sources configured to provide second light source light, the second light source light having a spectral distribution different from the first light source light; and
one or more optical filters downstream from the second subset of light sources configured to convert less than 20% of said second light source light;
wherein the one or more optical filters have the same color appearance as the off-state color appearance of the first subset of light sources.

20. The lighting device according to claim 19, wherein the one or more optical filters have the same hue as the off-state color appearance of the one or more first light sources, and wherein in addition to hue, one or more of lightness and saturation are the same.

* * * * *